(12) United States Patent
Thakur et al.

(10) Patent No.: US 7,904,846 B2
(45) Date of Patent: Mar. 8, 2011

(54) METHOD FOR AUTOMATICALLY EXTRACTING A FUNCTIONAL COVERAGE MODEL FROM A CONSTRAINT SPECIFICATION

(75) Inventors: Shashidhar Anil Thakur, Santa Clara, CA (US); Rahul Hari Dani, San Jose, CA (US); Ramnath N. Rao, Milpitas, CA (US)

(73) Assignee: Synopsys, Inc., Mountain View, CA (US)

( * ) Notice: Subject to any disclaimer, the term of this patent is extended or adjusted under 35 U.S.C. 154(b) by 475 days.

(21) Appl. No.: 11/831,745

(22) Filed: Jul. 31, 2007

(65) Prior Publication Data
US 2009/0037859 A1 Feb. 5, 2009

(51) Int. Cl.
G06F 17/50 (2006.01)
G06F 9/45 (2006.01)

(52) U.S. Cl. ............... 716/5; 716/4; 716/18; 703/13; 703/14; 714/724; 714/728; 714/738; 714/739; 714/741

(58) Field of Classification Search ............ 716/4–5, 716/18; 703/13–14; 714/724, 728, 738–739, 714/741
See application file for complete search history.

(56) References Cited

U.S. PATENT DOCUMENTS

| | | | |
|---|---|---|---|
| 5,913,023 A * | 6/1999 | Szermer | 714/38 |
| 6,141,630 A | 10/2000 | McNamara et al. | |
| 6,499,127 B1 | 12/2002 | Kim et al. | |
| 6,684,359 B2 | 1/2004 | Noy | |
| 6,816,825 B1 | 11/2004 | Ashar et al. | |
| 6,925,617 B2 | 8/2005 | Bayraktaroglu et al. | |
| 6,975,976 B1 * | 12/2005 | Casavant et al. | 703/14 |
| 7,107,553 B2 * | 9/2006 | Lockyear et al. | 716/4 |
| 7,114,111 B2 * | 9/2006 | Noy | 714/738 |
| 7,243,087 B2 | 7/2007 | Iyer | |
| 2004/0249618 A1 | 12/2004 | Fine et al. | |
| 2006/0048026 A1 | 3/2006 | Fine et al. | |

OTHER PUBLICATIONS

Lachish, O. et al. "Hole Analysis for Functional Coverage Data", Design Automation Conference (DAC), Jun. 10-14, 2002, pp. 6.
Fine, S. et al. "Coverage Directed Test Generation for Functional Verification using Bayesian Networks", Design Automation Conference (DAC), 2003, pp. 6.
Wagner, I. et al. "StressTest: An Automatic Approach to Test Generation Via Activity Monitors", Design Automation Conference (DAC), Jun. 13-17, 2003, pp. 6.
Rosenberg, S. et al. "Coverage-Driven Functional Verification", Sep. 2001, http://www.verisity.com/resources/whitepaper/coverage driven.html, pp. 7.

(Continued)

*Primary Examiner* — Nghia M Doan
(74) *Attorney, Agent, or Firm* — Silicon Valley Patent Group LLP; Omkar Suryadevara (57) ABSTRACT

A computer is programmed to automatically generate in memory, goals for functional verification of a design of a circuit by use of constraints that are specified in the normal manner. Specifically, a predetermined set of rules are automatically applied to the constraints, on random values for signals to be input to the circuit during simulation of the design. Application of the rules identifies one or more templates of goal(s) to be met. The computer is programmed to automatically use constraint(s) and template(s) to instantiate goal(s) in memory. Each goal identifies a signal to be input to the circuit, and defines a counter for a value of the signal. The goals are used in the normal manner, i.e. used to measure coverage of functional verification during simulation of the design of the circuit.

41 Claims, 7 Drawing Sheets

OTHER PUBLICATIONS

Mishra, P. et al. "Functional Coverage Driven Test Generation for Validation of Pipelined Processors", Mar. 12, 2004, CECS Technical Report #04-05, Center of Embedded Computer Systems, University of California, Irvine, California, pp. 19.

"Constrained-Random Test Generation and Functional Coverage with Vera®", Feb., 2003, Synopsys, Inc., pp. 8.

Iyer, M. A. et al. "Race: A World-Level ATPG-Based Constraints Solver System for Smart Random Simulation", 2003, IEEE, pp. 10.

Hekmatpour, A. et al "Coverage-Directed Management and Optimization of Random Functional Verification", 2003, IEEE, pp. 8.

Liu, C. et al. "CAMA: A Multi-Valued Satisfiability Solver", University of California at Berkeley, CA, USA, believed to be prior to Jul. 31, 2007, pp. 8.

Damiano, R. et al. "Checking Satisfiability of a Conjunction of BDDs", DAC, 2003, pp. 6.

Ganai, M. K. et al. "Combining Strengths of Circuit-based and CNF-based Algorithms for a High-Performance SAT Solver", Jun. 10-14, 2002, DAC, New Orleans, Louisiana, USA, pp. 14.

Piziali, A. Chapter 7 in a book "Functional Verification Coverage Measurement And Analysis", 2004, Kluwer Academic Publishers, pp. 11.

Grinwald, R. et al. "User Defined Coverage—A Tool Supported Methodology for Design Verification" 35$^{th}$ Design Automation Conference, 1998, San Francisco, CA., USA, pp. 6.

Pixley, C. et al. "SoCKit", believed to be prior to Jul. 31, 2007, pp. 3.

"SystemVerilog 3.1a Language Reference Manual Accellera's Extensions to Verilog®", http://www.eda.org/sv/SystemVerilog_3.1a.pdf, 2004, pp. 586.

* cited by examiner

METHOD FOR AUTOMATICALLY EXTRACTING A FUNCTIONAL COVERAGE MODEL FROM A CONSTRAINT SPECIFICATION

CROSS REFERENCE TO RELATED APPLICATION

This application is related to and incorporates by reference herein in its entirety U.S. patent application Ser. No. 11/831,673 entitled "Method for Automatic Maximization of Coverage In Constrained Stimulus Driven Simulation" that is commonly owned and concurrently filed on Jul. 31, 2007, now issued as U.S. Pat. No. 7,617,468.

BACKGROUND

1. Field of the Invention

The invention relates to design of tests that are used in simulation of design(s) of circuits. More specifically, the invention relates to a method and an apparatus for automatically generating goals used to evaluate functional coverage in stimulus driven simulation of the circuit designs that are typically implemented in integrated circuit (IC) chips.

2. Related Art

Figure 1:
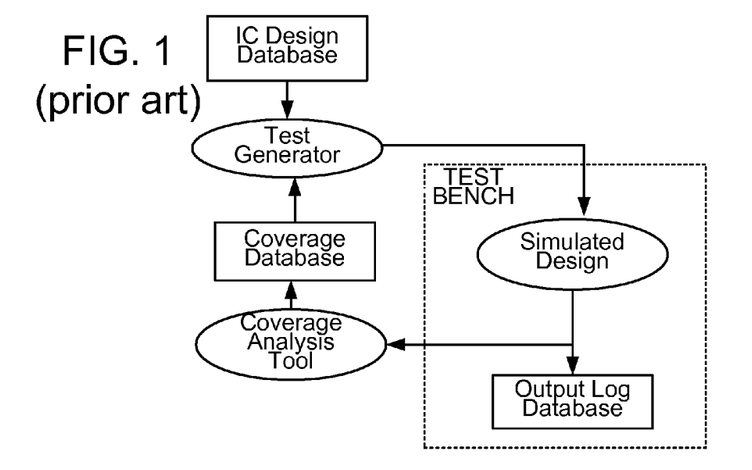
FIG. 1 illustrates a prior art system for automated design verification which includes a test generator, a simulated design and a coverage analysis tool.

In the design of integrated circuit (IC) chips, it is common to test IC designs by use of a testbench. A test bench in a high-level verification language (HVL) environment includes test generators that randomly generate input signals for the IC design (expressed in a hardware description language, HDL). U.S. Pat. No. 6,141,630 granted to McNamara, et al. on Oct. 31, 2000 entitled "System and method for automated design verification" is incorporated by reference herein in its entirety as background. This patent describes a coverage analysis tool (see FIG. 1 attached hereto) which monitors output data from a simulated design and identifies portions of the simulated design that remain to be tested. The coverage analysis tool updates a coverage database. A test generator is coupled to the IC design database and the coverage database. The test generator produces and sends test vectors to the test bench which exercise (i.e., test) the portions of the simulated design that the coverage analysis tool has indicated still remain untested. The simulated design includes software, expressed in a HDL language such as Verilog or VHDL which is executed within a computer to model the operational characteristics of the circuit being designed.

Values of test vectors may be generated randomly in the belief that events of interest to the user will be reached and recognized as simulation progresses over time. However, there is no guarantee that such events will in fact occur during a limited duration within which simulation is performed, or that such events will occur even if the simulation duration is infinitely long. Some prior art testbenches allow the users to manually specify constraints on signals to be input to a circuit design's simulation. Such testbenches also allow events of interest to be manually specified by the user, in the form of "goals." User-specified goals are typically used during simulation, to measure functional coverage of the tests. Users can review the effectiveness of tests (during simulation) in covering the specified goals, and if appropriate also create values for stimulus signals (either manually or by specifying additional directives to test generators) to attempt to achieve coverage of any events that have not yet occurred (also called "holes").

Such prior art testbenches typically require the user to manually write up constraints on input signals, e.g. as per U.S. Pat. No. 6,499,127 incorporated by reference herein in its entirety. The user may also manually write up goals for the simulation. Such goals and/or constraints may be typically written in a hardware verification language (HVL) called "SYSTEMVERILOG" which is described in, for example, a document entitled "SystemVerilog 3.1a Language Reference Manual Accellera's Extensions to Verilog®" available at http:%%www.eda.org%sv%SystemVerilog_3.1a.pdf (wherein "/" is replaced by "%"), and this document is incorporated by reference herein in its entirety as background. An alternative HVL language is called OpenVera and is used by the VERA tool available from Synopsys, Inc. For more information on OpenVERA, see the book entitled "The Art of Verification with VERA" published September 2001 by Faisal Haque, Jonathan Michelson, and Khizar Khan that is incorporated by reference herein in its entirety. This book is available for purchase at http:%%www.verificationcentral.com%. Use of OpenVERA is also described in U.S. Pat. No. 6,925,617 that is incorporated by reference herein in its entirety, as background.

SUMMARY

A computer is programmed in accordance with the invention to automatically generate in memory, goals for functional verification of a design of a circuit by use of constraints that are specified by a user in the normal manner. Specifically, in several embodiments of the invention, a predetermined set of rules are automatically applied to the constraints, which impose limits on random values for signals to be input to the circuit during simulation of the design. Application of the rules identifies one or more templates of goal(s) to be met. The computer is further programmed to automatically use the goal template(s) with information from the constraints, to instantiate goal(s) in memory. Each goal identifies a signal to be input to the circuit, and defines a counter for a value of the signal. The goals are used in the normal manner, i.e. used to measure coverage of functional verification during simulation of the design of the circuit.

DETAILED DESCRIPTION

A computer 200 (FIG. 2) is programmed with software 250 ("coverage generator") to read constraints on input signals of an integrated circuit (IC) design from a constraints specification file 212C, and automatically create goals for the input signals in a coverage specification file 212A. The two files are typically held in a non-volatile memory of computer 200, and in some illustrative embodiments both files are expressed in a Hardware Verification Language (HVL), such as OpenVera or System Verilog. The constraints specification file 212C is typically written manually by a person knowledgeable about the IC design that is being tested, e.g. by use of any text editor, in conformance with an appropriate Hardware Verification Language (HVL).

On receipt of the constraints specification in file 212C, computer 200 operates initially in a manner similar or identical to any prior art compiler for HVL, such as a compiler for OpenVera or SYSTEM VERILOG. Specifically, coverage generator 250 (FIG. 2) parses the text within file 212C in an operation 251 to identify each constraint by use of a predetermined grammar and keywords of the language used in file 212C (such as one or more of "rand", "constraint", "inside" and "foreach"). Thereafter, computer 200 generates in memory 215 a binary representation of each constraint. Such in-memory constraints may stored in (and retrieved from) a memory of computer 200 using any data structure well known in the art, such as an abstract symbol tree (AST) and/or a linked list. Depending on the embodiment, lexical analysis and/or parsing in operation 251 may be performed by use of any OpenVera compiler of the type available from Synopsys, Inc. of Mountain View, Calif., or alternatively any System Verilog compiler that may be available in the industry, such as Questa compiler available from Mentor Graphics.

After operation 251, computer 200 (FIG. 2) performs semantic checks on the constraints in memory 215, in an operation 252. Specifically, in some embodiments of the invention, use of a constraint solver 217 (such as a satisfiability engine) requires the constraints in memory 215 to satisfy several conditions. As an example, constraints solver 217 may require certain types of functions to not be used in constraint expressions, such as functions that have side effects. A function may have side effects if instead of (or in addition to) observing non-input signals of a circuit whose design is being simulated (by a HDL simulator that uses test vectors 218), the function also changes a value of a non-input signal (which may be an output signal or an internal signal of the circuit under test). Accordingly, a semantic checker in computer 200 is programmed in operation 252 to remove and/or notify user of (i.e. flag) any constraint generated by operation 251 if the constraint uses such a function (with side effects). As another example, semantic checking operation 252 may ensure that a function is called before the constraint which uses the function is to be solved.

Figure 2:
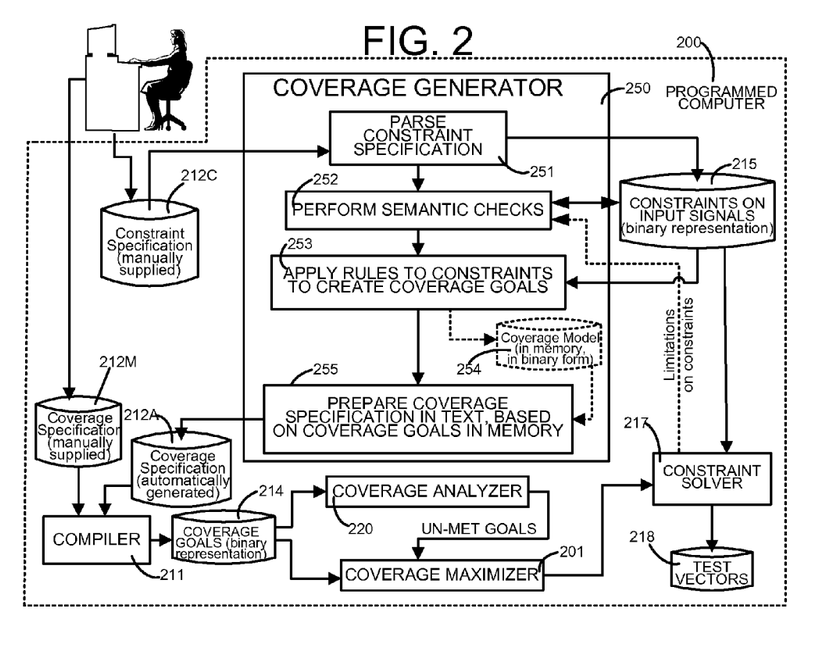
FIG. 2 illustrates, in a high level block diagram, a computer that has been programmed in accordance with the invention with software ("coverage generator") to use constraints that are manually supplied to automatically create goals for functional verification, in simulation of a circuit's operation by use of test vectors.

Semantic checking operation 252 of some embodiments also checks for, flags and removes any constraint that uses a signal of a user defined class type in an expression that is of a set membership type. Also, semantic checking operation 252 for languages that allow a "foreach" type of constraint on array type of signals may be programmed to check for, flag and remove any "foreach" type of constraint that uses a signal that has been declared to be of scalar type. Semantic checking operation 252 may also check for, flag, and remove constraints whose expressions use port or interface signals, because such signals are normally designed to be directly connected to the circuit. Any number of such semantic checks may be performed in operation 252 depending on the limitations on constraints that are imposed by constraint solver 217.

After operation 252 to enforce the constraint solver's limitations, computer 200 (FIG. 2) performs an operation 253 wherein the computer automatically applies a number of rules to the constraints in memory 215 to create coverage goals in an internal memory 254. The coverage goals are typically included in a data structure for a coverage model in binary form in memory 254. Operation 253 of computer 200 is easily understood conceptually by example. Accordingly, assume in one example, the following constraint is present in memory 215:

class Bus; rand bit [15:0] addr; constraint wordalign {addr [1:0]==2'b0;} endclass In the above example, a constraint of name wordalign contains an expression (specified between open brace "{" and close brace "}" as per System Verilog or OpenVERA syntax). The expression uses an equal-to operator "==", and hence it constitutes an equality type of expression, which is one of several types of expressions that are supported in the HVL language. Computer 200 is pre-programmed with a rule that uses a template (called "constraint template") for each type of expression. In this example, computer 200 recognizes an equality expression type based on the presence of the equal-to operator within the expression. Such programming will be readily apparent to the skilled artisan in view of this detailed description.

When any expression is recognized within a constraint, computer 200 automatically customizes a predetermined goal template that is associated with the rule that recognized the constraint, based on information obtained from the constraint, to create a coverage goal. Specifically, in the above example for constraint wordalign, computer 200 creates a single goal in an internal memory 254 (FIG. 2) for bits 1 and 0 of signal addr, to keep count of the situation when each bit is of target value 0. In some embodiments, this goal is created in memory 254 with a unique name, such as "coverage_wordalign", that is based on the constraint's name wordalign. To make a newly-created goal's name unique, a number (such as a count of the number of goals created so far) may be included in the goal's name. The new goal, when created in memory 254, typically includes the signal's name and a target value for the signal. The new goal also includes a counter (also known as a "bin") that is automatically incremented when the signal attains its target value during simulation of the circuit's design. Such counters identify whether or not the target values of signals have been reached, and if so how many times the targets have been reached (either for a signal alone—in the form of cover point goals on a single signal; or for signals in combination—in the form of cross point goals on multiple signals).

Any number of rules may be applied in operation 253, and on completion of this operation 253 a number of goals derived from manually supplied constraints are now present in binary form in a coverage model in memory 254. Next, in some embodiments, computer 200 performs an operation 255 to prepare textual form of coverage goals in memory 254, the textual form being expressed in a coverage specification 212A. The textual representation of the coverage goals in specification 212A has an advantage as follows over the binary representation in memory 254: specification 212A can be treated same as any other coverage goal specification, such as specification 212M that is manually supplied. Note that in some embodiments, operation 253 is not performed and specification 212A is not created and instead the goals in binary form in memory 254 are directly used by a coverage analyzer 220 and/or by a coverage maximizer 201 as discussed next.

In embodiments wherein specification 212A is created, a compiler 211 may be used to process both specifications 212M and 212A to generate a binary representation of coverage goals 214 as described in detail in the related U.S. patent application Ser. No. 11/831,673 incorporated by reference above. Such goals 214 may then be used by a coverage analyzer 220 to identify unmet goals that in turn may be used by a coverage maximizer 201 to supply constraints to constraint solver 217 for generation of test vectors 218. As noted above, test vectors 218 are used in testing and functional verification by simulation of a design (in HDL) of a circuit.

Above-described operation 253 of applying rules to constraints to create coverage goals can be performed in any of a number of different ways that will be apparent to the skilled artisan in view of the above description. By way of illustration, as an example, operation 253 is performed in some embodiments of the invention by a method shown in FIG. 3A, as follows. Specifically, computer 200 is programmed with two loops, an outer loop implemented by acts 311 and 317 is performed on all constraints (in memory 215) and an inner loop implemented by acts 312 and 316 is performed on all rules. Within the inner loop, computer 200 checks in act 313 if the current constraint matches a constraint template in a current rule. If there is no match, computer 200 goes to act 316 to check if all rules have been applied for the current constraint and if not returns to act 312 to apply an unapplied rule, but if all rules have been applied computer 200 goes to act 317. In act 317 computer 200 checks if all constraints have been processed and if not returns to act 311 to process an unprocessed constraint.

Figure 3A:
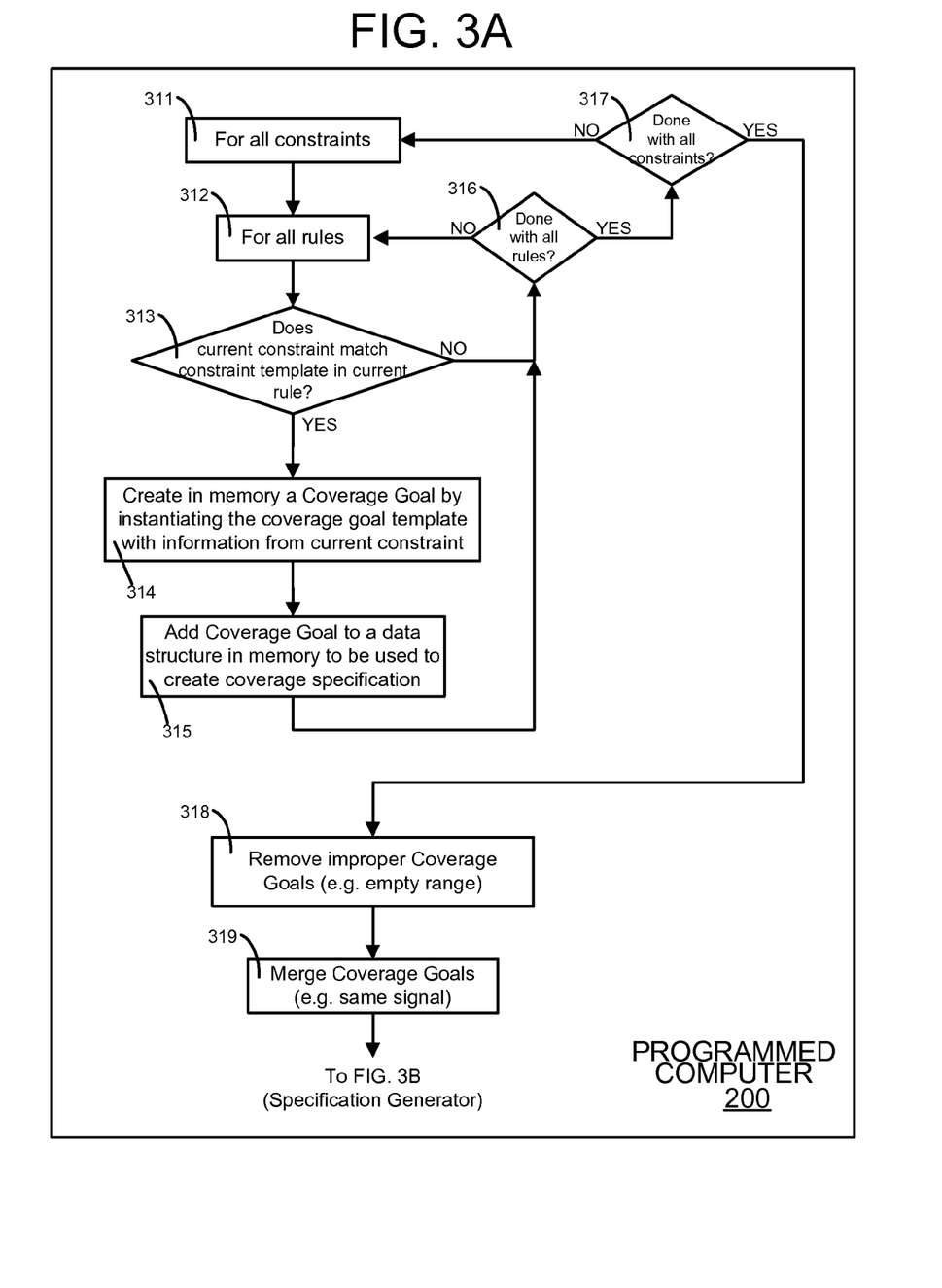
FIG. 3A illustrates, in a flow chart, an exemplary implementation of act 253 of FIG. 2 to create coverage goals by applying rules to constraints that is performed in some embodiments.

In act 313, if the current constraint matches a constraint template in the current rule, computer 200 goes to act 314. In act 314, computer 200 creates a coverage goal by instantiating a coverage goal template based on information from the current constraint. As noted in the example described above in reference to the constraint of name wordalign, information from the current constraint may include the name of the signal, the name of the constraint, and one or more target values. In addition, the coverage goal template may itself contain certain predetermined information, such as the type of goal (e.g. cover point, cross point, or covergroup) and/or one or more options (such as weight, comment, strobe etc), and all such predetermined information is also included in the goal that is instantiated by use of this template. Note that the term "coverage goal" as used in this description is different from and should not be confused with a "goal" type_option member of a cover group, cover point and cross point. The "goal" type_option member of the cover group, cover point or cross point is an integer number which represents the percentage of coverage goals that is desired to be achieved by simulation of the design. Typically this number is set to 100. Next, in act 315, the computer 200 adds the newly-created coverage goal to memory 254 (FIG. 2) that contains a coverage model accessed using a predetermined data structure, such as a linked-list, a stack or a queue. Thereafter, computer 200 goes to act 316 (described above).

In act 317, if all constraints have been processed, computer 200 performs one or more post processing operations which depend on the embodiment. For example, in act 318, computer 200 removes any coverage goal that may be improper, e.g. removes any goal that has an empty range of target values. An empty range of target values may arise, for example, if a set membership expression has identical values for maximum and minimum limits. Moreover, in another example, as per act 319 shown at the bottom of FIG. 3A, computer 200 merges goals that are for the same signal and for target values whose ranges overlap. As another example, if two goals are for the same signal and for the same target value, then one of the two goals is discarded. In performing post processing operations, computer 200 is programmed to appropriately account for any guard expression that may govern the goals being post processed. For example, if two goals have guard expressions that are exact inverse of each other then they may be merged into a single goal and with no guard expression.

Figure 3B:
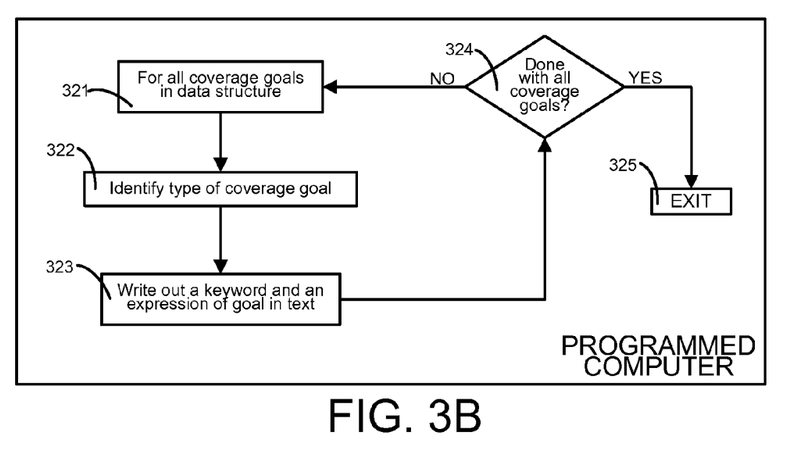
FIG. 3B illustrates, in another flow chart, an exemplary implementation of act 255 of FIG. 2 to prepare a coverage specification in text, based on coverage goals that are represented in a binary form in memory by the method of FIG. 3A.

After such post processing operations, computer 200 may perform operation 255 by executing the method illustrated in FIG. 3B. Specifically, computer 200 implements a loop in some embodiments, as per acts 321 and 324 over all the coverage goals in the coverage model in memory 254. Inside the loop, computer 200 performs act 322 to look up the goal in memory 254 and identify a type of the goal. Next, in act 323, computer 200 uses the goal's type to automatically identify a keyword and an expression which are then written out to coverage specification 212A. Coverage specification 212A can be expressed in any predetermined HVL language, such as SystemVerilog or OpenVERA, by appropriate use in act 323 of keyword(s) and expression(s) that are supported by the predetermined language. After act 323, computer 200 returns to act 324, and in act 324 if all coverage goals have been written out then exits as per act 325.

In several embodiments of the invention, computer 200 receives manually-specified constraints on values of input signals to be used in test vectors, in conformance with Section 12 of "SystemVerilog 3.1a Language Reference Manual Accellera's Extensions to Verilog®", while in another embodiment the constraints are specified in OpenVera. In some embodiments, computer 200 writes out the coverage goals in conformance with Section 20 of "SystemVerilog 3.1a Language Reference Manual Accellera's Extensions to Verilog®", while in another embodiment the coverage goals are specified in OpenVera.

Above-described act 314 of creating a coverage goal by instantiating a coverage template can be performed in any of a number of different ways that will be apparent to the skilled artisan in view of the above description. By way of illustration, as an example, act 314 is performed in some embodiments of the invention by a method shown in FIGS. 4A-4E, as follows. Specifically, computer 200 is programmed with a loop implemented by acts 411 and 417 that is performed on all signals of a constraint specification. Specifically, computer 200 checks (in act 411) whether or not a signal has a random attribute specified in the constraint specification, and if not specified, goes to act 417 to select another signal and thereafter return to checking in act 411.

Figure 4A:
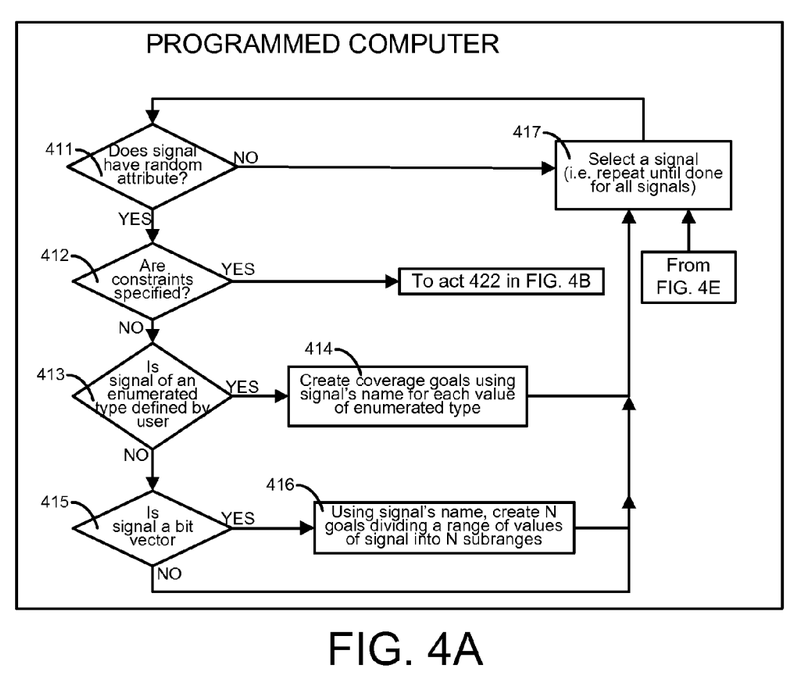
FIGS. 4A-4E together illustrate, in flow charts, acts that are performed in one embodiment, to implement act 314 illustrated in FIG. 3A.

In act 411, if the current signal does have the random attribute specified, then the computer goes to act 412 and checks whether or not a constraint is specified on the signal. If a constraint is specified, then computer 200 goes to act 422 which is described below in reference to FIG. 4B. If no constraint is specified, then computer 200 goes to act 413 and checks if the signal is of an enumerated type that has been defined by the user, and if so goes to act 414. In act 414, the computer of some embodiments creates several coverage goals using the signal's name, with one goal for each value of the enumerated type. For example, in an illustrative embodiment, the computer invokes an automatic bin creation mechanism to create N counters (also called bins), to keep count of N sampled values of the signal, where N is the cardinality of the enumeration. After act 414, computer 200 goes to act 417, described above.

In act 413, if the signal is not of an user-defined enumerated type, then computer 200 goes to act 415 and checks if the signal is a bit vector. If so, computer 200 goes to act 416 and creates coverage goals using the signal's name. Here too, if the signal's width is less than a predetermined limit (e.g. less than 9 bits), the computer of the illustrative embodiment simply invokes an automatic bin creation mechanism to create N bins, where N is preset to MIN (64, number of possible values for the bit vector). Essentially the entire value range for the signal is divided into N equal size subranges, with one coverage goal for each subrange, resulting in N goals. After act 416, computer 200 goes to act 417, described below in reference to FIG. 4D. If the answer is no in act 415, then again computer 200 goes to act 417.

Figure 4B:
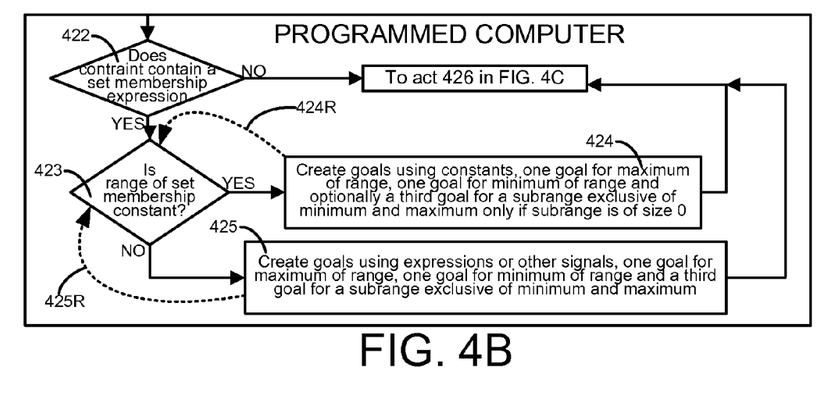

In a method illustrated in FIG. 4B, computer 200 checks for and processes a constraint that contains a set membership type of constraint expression. An example of the set membership type of constraint expression is as follows: class Bus; rand bit[15:0] addr; rand bit[31:0] data; endclass typedef enum {low, high} AddrType; class MyBus extends Bus; rand AddrType atype; constraint addr_range {(atype==low) →addr inside {[0:15]}; (atype==high)→addr inside {[16: 127]};} endclass. In this example, two sets have been declared by the user, namely [0:15] and [16:127]. Accordingly, in act 422, the computer checks if the current constraint contains a set membership type of expression (based on a template), and if so the computer proceeds to act 423 unless the answer is no in which case the computer goes to act 426 described below in reference to FIG. 4C.

In act 423 (FIG. 4B), the computer 200 checks if the range of the set membership in the constraint's expression is constant. In the above example, constants (namely 0, 15, 16 and 127) define the boundaries of the sets, and so the answer in act 423 is true, in which case the computer goes to act 424. In act 423, the computer creates several goals using the constants, with one goal for the maximum of a range and one goal for a minimum of a range and an optional third goal for a subrange exclusive of the maximum and minimum. The third goal is optional and not created if the subrange is of size 0. In the above example, for the first set membership type of constraint expression, namely (atype==low)→addr inside {[0:15], computer 200 therefore creates three goals for signal addr, one for signal addr having value 0, another for signal addr having value 15, and a third goal for signal addr having any value between 1 and 14. Similarly, additional goals are created, by repeating the checking in act 423 and the goal creation in act 424 for each set membership expression in the current constraint (as shown by dotted line 424R). In act 423, if the computer finds that the answer is no, then the set membership expression contains one or more expressions or variables, and act 425 is performed. Act 425 is similar to act 424 except that the goals are defined using the expressions or variables in the set membership expression instead of constants. This is different from act 424 in that new expressions composed out of the range expressions need to created by the computer 200. Computer 200 returns to act 423 if there are more range expressions in the constraint, and eventually when all the range expressions in the set membership constraint have been processed by the method in FIG. 4B, the computer goes to act 426, which is described next, in reference to FIG. 4C.

Figure 4C:
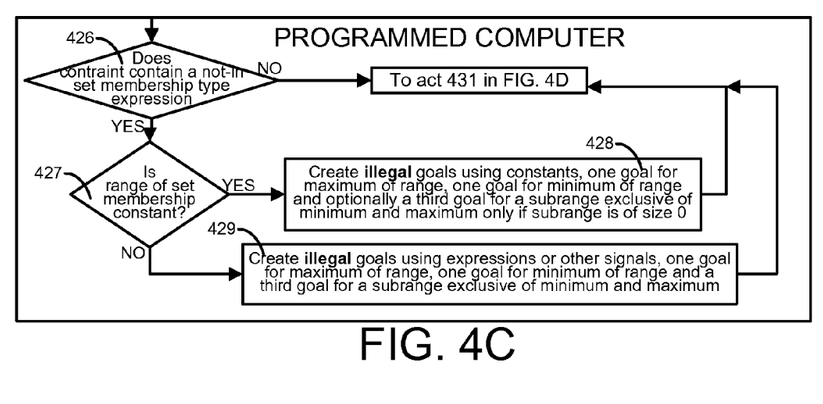

Computer 200 is further programmed to perform acts 426, 427, 428 and 429 illustrated in FIG. 4C in a manner similar or identical to that described above for corresponding acts 422, 423, 424 and 425 of FIG. 4B, except for the following differences. In all the acts of FIG. 4C, computer 200 handles one or more not-in set membership type of constraint expressions, and in creating the goals marks the goals as being of the "illegal" variety (e.g. "illegal_bins" in SystemVerilog). Accordingly, all values associated with such illegal goals are excluded from coverage. If any such value occurs, a run-time error is issued by the HDL simulator. In act 426 if the answer is no, then computer 200 goes to act 431 in FIG. 4D. Computer 200 goes to act 431 in FIG. 4D when all not-in set membership type of expressions have been processed by acts 427, 428 and 429.

Figure 4D:
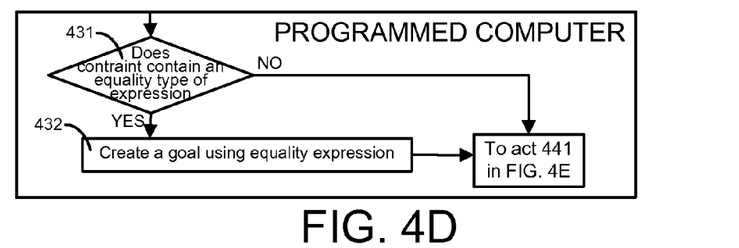

In act 431, the computer 200 checks if the constraint contains an equality type of expression. If the answer is no, then the computer goes to act 441 which is described below in reference to FIG. 4E. If the answer is yes in act 431, then the computer goes to act 432 and creates a goal using information from the equality expression, as illustrated by the example described in paragraphs [0018] and [0019] above. Thereafter, the computer goes to act 441 (FIG. 4E).

Figure 4E:
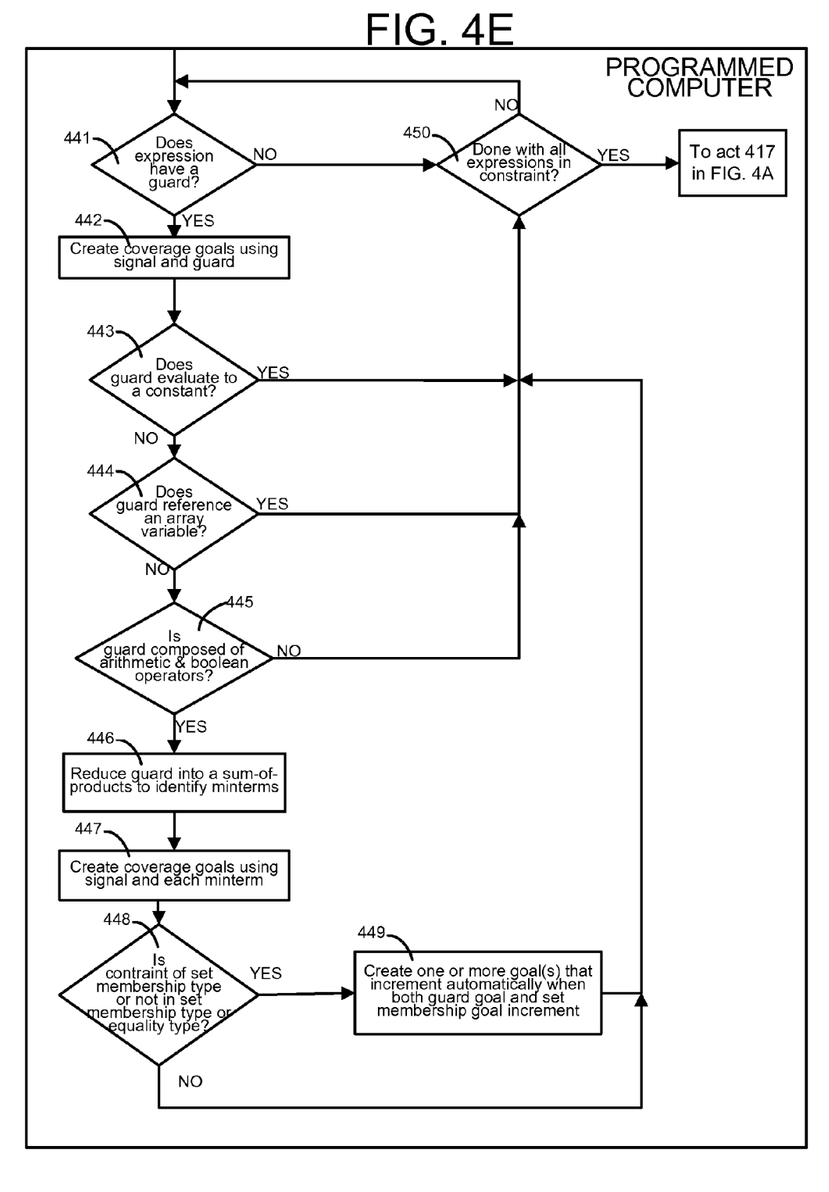

In a method illustrated in FIG. 4E, computer 200 checks for and handles guards within expressions in constraints. An example of a guard is as follows: constraint sort {if (next !=null) n<next.n;}. This constraint expression indicates that the specified constraint on signal "n" (to be less than next.n) is to be created only if signal "next" is not null. Accordingly, computer 200 implements a loop using acts 441 and 450 over all constraint expressions to see if any of them contain guards, and each guard that is found is processed as acts within the loop, namely acts 442-449 as discussed next.

In act 442, the computer automatically adds a condition on the goal that was created for the current constraint. In some embodiments, the expression that was used in the guard for the constraint is used as the basis for the condition on the corresponding goal (e.g. the same expression may be used). Next, in act 443, the computer checks if the guard evaluates to a constant and if so, returns to act 450 (i.e. nothing more is done with the guard). If the answer is no in act 443, then the computer goes to act 444 and checks if the guard references an array variable and if so again goes to act 450. If no array variable is referenced by the guard, the computer goes to act 445 and checks if the guard is composed of only arithmetic and Boolean operators. If there are any operators other than arithmetic and Boolean operators, then the computer returns to act 450. If the answer in act 445 is yes, then the computer performs acts 446-449 as discussed next.

In act 446, the computer reduces the expression of the guard into a sum-of-products (SOP) form to identify minterms therein. Next, in act 447 the computer creates coverage goals using the signal and each minterm in the SOP. The goal's value is set to (minterm==1), so the goal monitors the case where this particular minterm is true. In essence, a goal is created for every possible way in which the expression can evaluate to TRUE (represented by the Boolean value 1). In some embodiments, the computer also creates an additional goal for the entire expression of the guard. Next, the computer goes to act 448 to check if the constraint is of a set membership type or a not-in set membership type. If the answer in act 448 is yes, then the computer goes to act 449 and creates additional goals. Specifically, a cross point goal is created in act 449, to cross a cover point goal that was created for the guard, with a cover point goal that was created for the set membership or not-in set membership constraint. Then the computer goes to act 450 (described above). The computer also goes to act 450 if the answer in act 448 is no.

Depending on the embodiment, one or more additional acts may be performed by the method illustrated in FIGS. 4A-4E. For example, some embodiments create comments for every goal that is created, and the comment identifies the expression in the constraint, on which the goal is based. Also, certain embodiments do not create goals for constraints that are of the "foreach" type, which are typically used on arrays of composite objects (such as instances of a user defined class). Several embodiments also check for and identify any cover point goals that have not been used in a cross point goal and one or more such unused cover point goals are used to create additional cross point goals. Moreover, certain embodiments assign names to goals that are automatically created by computer 200, to start with a predetermined prefix, such as "covp" for cover point goal and "covc" for a cross point goal. Use of the prefix enables a user to easily distinguish between manually supplied goals (as per specification 212M), and automatically created goals (as per specification 212A). Similarly, names of the counters (i.e. bins) are also prefixed in some embodiments, with a predetermined string, such as "covbin."

Figure 5A:
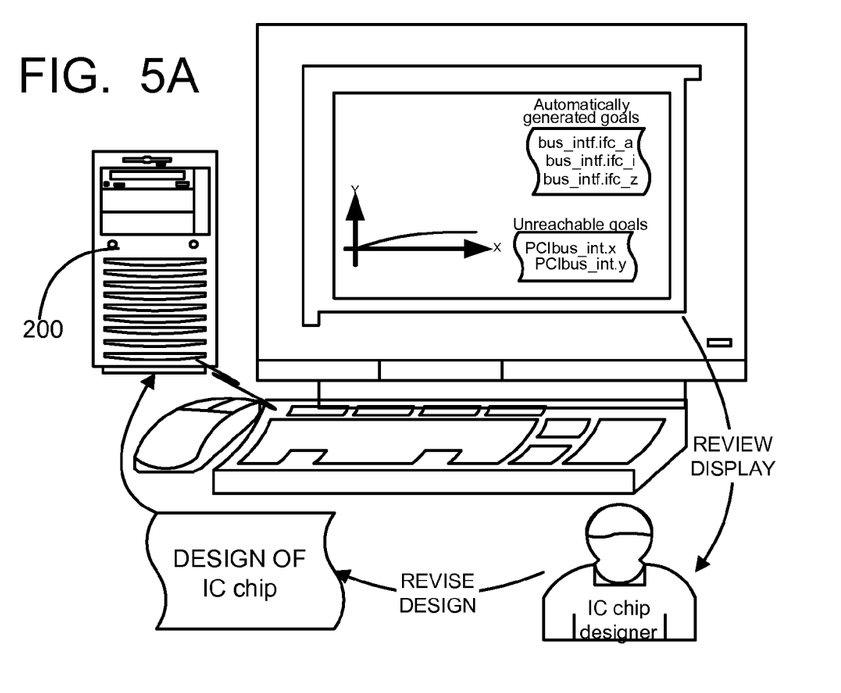
FIG. 5A illustrates, in a block diagram, a computer that is programmed in accordance with the invention.
Figure 5B:
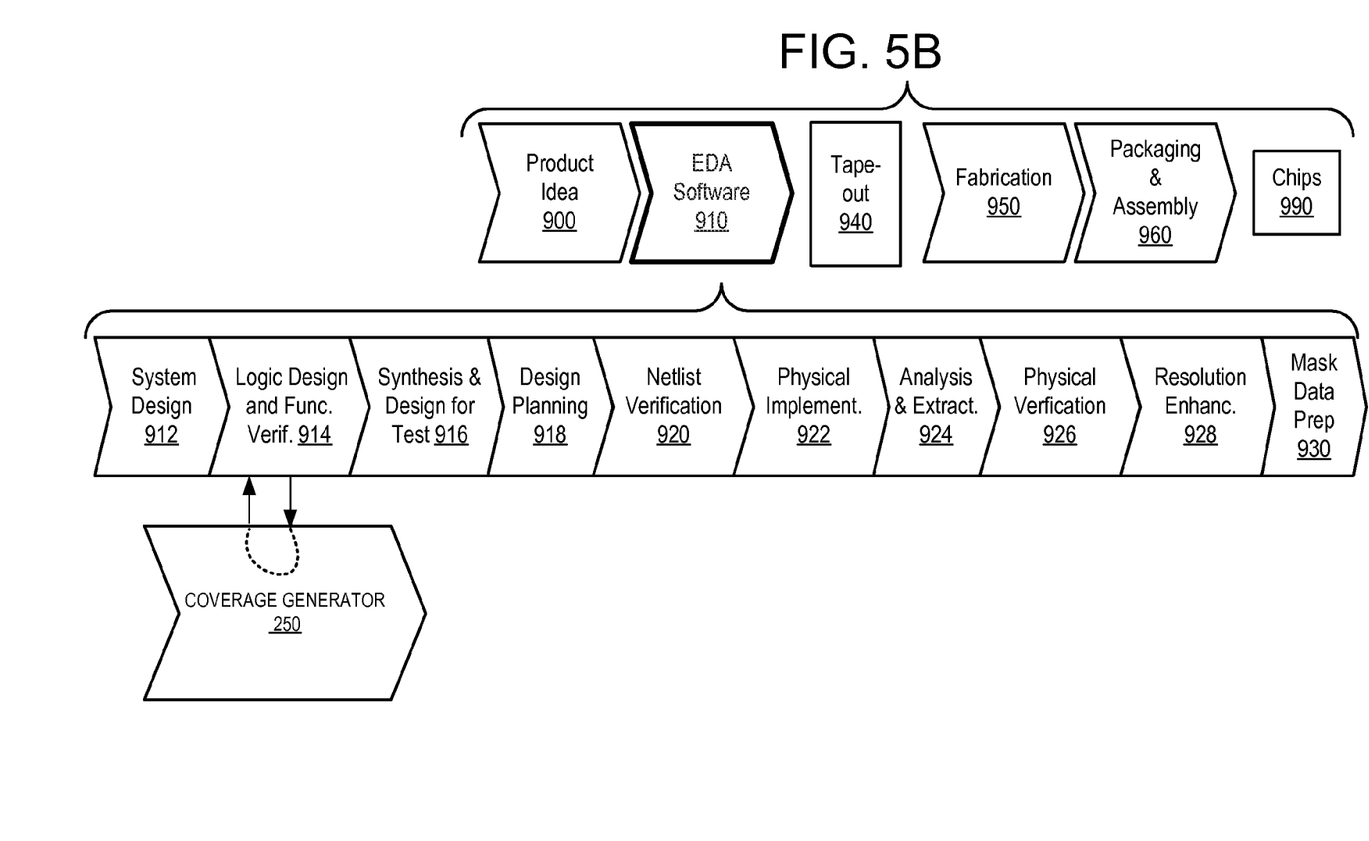
FIG. 5B illustrates, a simplified representation of an exemplary digital ASIC design flow in accordance with the invention.

Any coverage generator of the type described above may be used in a digital ASIC design flow, which is illustrated in FIG. 5B in a simplified exemplary representation. At a high level, the process of designing a chip starts with the product idea (900) and is realized in a EDA software design process (910). When the design is finalized, it can be taped-out (event 940). After tape out, the fabrication process (950) and packaging and assembly processes (960) occur resulting, ultimately, in finished chips (result 990).

The EDA software design process (910) is actually composed of a number of stages 912-930, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 910) will now be provided.

System design (stage 912): The circuit designers describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 914): At this stage, the VHDL or Verilog code for modules in the system is written and the design (which may be of mixed clock domains) is checked for functional accuracy. More specifically, does the design as checked to ensure that produces the correct outputs. Exemplary EDA software products from Synopsys, Inc. that can be used at this stage include VCS, VERA, DesignWare®, Magellan, Formality, ESP and LEDA products. A coverage generator 250 (FIG. 2) is used in this stage in some embodiments of the invention. If the displayed results are not satisfactory, a chip designer may go back to stage 912, to make changes to their IC design.

Synthesis and design for test (stage 916): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products.

Design planning (stage 918): Here, an overall floorplan for the chip is constructed and analyzed for timing and top-level routing. Exemplary EDA software products from Synopsys, Inc. that can be used at this stage include Jupiter and Flooplan Compiler products.

Netlist verification (stage 920): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime products.

Physical implementation (stage 922): The placement (positioning of circuit elements) and routing (connection of the same) occurs at this step. Exemplary EDA software products from Synopsys, Inc. that can be used at this stage include the Astro product. Although circuitry and portions thereof (such as rectangles) may be thought of at this stage as if they exist in the real world, it is to be understood that at this stage only a layout exists in a computer 200. The actual circuitry in the real world is created after this stage as discussed below.

Analysis and extraction (stage 924): At this step, the circuit function is verified at a transistor level, this in turn permits what-if refinement. Exemplary EDA software products from Synopsys, Inc. that can be used at this include Star RC/XT, Raphael, and Aurora products.

Physical verification (stage 926): At this stage various checking functions are performed to ensure correctness for: manufacturing, electrical issues, lithographic issues, and circuitry. Exemplary EDA software products from Synopsys, Inc. that can be used at this include the Hercules product.

Resolution enhancement (stage 928): This involves geometric manipulations of the layout to improve manufacturability of the design. Exemplary EDA software products from Synopsys, Inc. that can be used at this include iN-Phase, Proteus, and AFGen products.

Mask data preparation (stage 930): This provides the "tape-out" data for production of masks for lithographic use to produce finished chips. Exemplary EDA software products from Synopsys, Inc. that can be used at this include the CATS(R) family of products. Actual circuitry in the real world is created after this stage, in a wafer fabrication facility (also called "fab").

The data structures and software code for implementing one or more acts described in this detailed description can be encoded into a computer-readable storage medium, which may be any storage medium that can hold code and/or data for use by a computer. Storage medium includes, but is not limited to, magnetic and optical storage devices such as disk drives, magnetic tape, CDs (compact discs), and DVDs (digital versatile discs).

Note that a computer system used in some embodiments to implement a coverage generator of the type described herein uses one or more linux operating system workstations (based on IBM-compatible PCs) or unix operating systems workstations (e.g. SUN Ultrasparc, HP PA-RISC, or equivalent), each containing a 2 GHz CPU and 1 GB memory, that are interconnected via a local area network (Ethernet).

Numerous modifications and adaptations of the embodiments described herein will become apparent to the skilled artisan in view of this disclosure. Certain operations that are performed by coverage generator 250 of some embodiments are illustrated below in Appendix A.

APPENDIX A

Analyze all variables and constraint blocks in a class definition
For all the variables declared as rand
   If the variable is of enum type of or type bit vector with width less than 9 bits then
     Create an auto binned cover point with the cover point expression being the rand variable itself For all the constraint expressions in the class
  If the constraint expression is not of set membership type OR "not in" set membership type or not a simple relational (i.e. using relation operators) then skip the constraint expression
  If the constraint expression contains a guard condition, then the guard condition should be added as a guard expression for any cover point that is created for the constraint expression
  If the constraint expression is of set membership type then
    Create a cover point with the cover point expression being the same as the left hand side (LHS) expression in the set membership constraint
    For every range in the right hand side (RHS) of the set membership constraint expression, create 3 user defined value bins
      One bin for the low expression in the range,
      One bin for the high expression in the range,
      One bin for all values in between (non-inclusive)
      If the ranges are expressed as compile time constants then the same constants are used to create the bin expressions
      If the ranges are expressed as compile time variables, then the bin ranges are composed from these variables.
  If the constraint expression is of type "not in" set membership then
    Create a cover point with the cover point expression being the same as the left hand side (LHS) expression in the set membership constraint.
    Create a user defined bin of type ILLEGAL VALUE with the ranges for the bin being the same as the ranges on the RHS of the constraint expression
  Analyze the guard expression (if any) on the constraint expression and convert into a sum of products (SOP) form using BDD based logic minimization techniques.
  If the conversion is successful
    Create a cover point with the cover point expression being the full unchanged guard expression and one value bin with the bin expression being the constant 1.
    For every minterm in the SOP form of the guard expression
      Create a value bin with the bin expression being (1) and the bin guard expression being (minterm==1)
    Create a cross point composed of the above two cover points
  If the constraint expression if of "equality" type then
    Create a cover point with the cover point expression being the same as the constraint expression
    Create a bin for the above cover point with the value of the bin being 1 (or TRUE)
For any cover point created above which is not included in a cross, create new cross point and include as many cover points till the total number of cross bins exceeds 65536 (64*1024)
Go over all cover points and merge the bins of cover points that have the same cover point expression
Go over all cover points and delete any empty bins

What is claimed is:

1. A computer-implemented method, to generate in memory, goals for functional verification of a design of a circuit, the method comprising:
receiving a plurality of constraints on a plurality of signals input to the circuit during simulation of the design;
wherein each signal in said plurality of signals is declared as having a random attribute in an object of a class defined in a hardware verification language;
a programmed computer automatically applying at least a predetermined rule comprising a constraint template to at least one constraint in said plurality of constraints, and based on an expression in said at least one constraint to identify a goal template of a new goal to be met by said functional verification during said simulation; and
automatically creating said new goal in a memory of said programmed computer, by instantiation of said goal template with information from said at least one constraint;
wherein said new goal identifies a signal in said plurality of signals by a name and a target value for said signal, and defines a counter for said signal.

2. The method of claim 1 wherein:
said at least one constraint comprises a set membership expression on said signal;
said automatically applying comprises automatically parsing said at least one constraint using a grammar of said hardware verification language to identify at least said name of said signal, and a pair of limits of least one range in said set membership expression.

3. The method of claim 2 wherein:
if within said range, a subrange non-inclusive of each limit in said pair of limits is of size greater than 1, then said automatically creating defines a plurality of counters for said signal, including said counter and an additional counter.

4. The method of claim 2 further comprising:
expressing additional goals in said hardware verification language to comprise at least said name and an additional counter.

5. The method of claim 2 further comprising:
expressing said goal in said hardware verification language to comprise at least said name and a plurality of illegal value counters including said counter, said plurality of illegal value counters comprising a counter for each limit in said pair of limits.

6. The method of claim 2 further comprising:
expressing an additional goal in said hardware verification language to comprise at least said name of said signal and an additional counter for said signal.

7. The method of claim 1 wherein:
said expression comprises a not in set membership expression on said signal; and
said automatically applying comprises automatically parsing said at least one constraint using a grammar of said hardware verification language to identify at least said name of said signal, and a pair of limits of least one range based on said not in set membership expression.

8. The method of claim 1 wherein:
said expression comprises an equality expression on said signal;
said automatically applying comprises automatically parsing said at least one constraint using a grammar of said hardware verification language, to identify at least said name of said signal and said target value, from said equality expression.

9. The method of claim 1 wherein:
an additional signal input to the circuit during simulation of the design is further declared as having said random attribute and no constraint is received on said additional signal by said receiving; and
the method further comprises applying an additional rule to check if a type of said additional signal is an enumerated type defined by a user and if so automatically using an additional goal template to instantiate an additional goal in said memory;

wherein said additional goal identifies said additional signal and defines at least one additional counter thereof.

10. The method of claim 1 wherein:
an additional signal input to the circuit during simulation of the design is further declared as having said random attribute and no constraint is received on said additional signal by said receiving; and
the method further comprises applying an additional rule to check if a type of said additional signal is a bit vector of width less than a predetermined limit and if so automatically using an additional goal template to instantiate an additional goal in said memory;
wherein said additional goal identifies said additional signal and defines at least one additional counter thereof.

11. The method of claim 1 wherein:
a guard expression, on creation of said at least one constraint, is received in a declaration of said at least one constraint;
said automatically applying comprises automatically parsing said declaration using a grammar of said hardware verification language to identify said guard expression and at least said name of said signal.

12. The method of claim 11 wherein:
said guard expression comprises a plurality of operators and said guard expression does not evaluate to a constant at compile time and said guard expression does not contain any reference to an array variable;
said automatically applying identifies a plurality of minterms by automatically reducing said guard expression into a sum-of-products; and
the method comprises defining at least one counter for each minterm in said plurality of minterms.

13. The method of claim 11 further comprising:
expressing said goal in said hardware verification language to comprise at least said name and a condition comprising said guard expression.

14. The method of claim 1 wherein said goal is hereinafter first goal and said counter is hereinafter first counter, and wherein:
said expression comprises either a set membership expression or a not in set membership expression;
a guard expression on creation of said at least one constraint is received in a declaration of said at least one constraint;
the method comprises expressing said goal in said hardware verification language to comprise at least said name and said first counter for a limit identified in said set membership expression;
the method comprises including a second goal comprising a second counter for a minterm in said plurality of minterms; and
the method comprises including a third goal comprising a third counter that increments automatically when each of said first counter and said second counter increments.

15. The method of claim 1 further comprising:
using a constraint solver to automatically generate a test vector by use of said plurality of constraints;
using a semantic checker to check said plurality of constraints for at least one limitation on use of said constraint solver; and
storing said test vector in said memory.

16. The method of claim 1 wherein:
said automatically applying comprises automatically parsing said at least one constraint using a grammar of said hardware verification language to identify at least said name of said signal and said expression.

17. One or more computer-readable storage media comprising:
a plurality of constraints on a plurality of signals input to a design of a circuit during simulation of the design;
wherein each signal in said plurality of signals is identified in said computer-readable medium as having a random attribute in an object of a class defined in a hardware verification language;
an instantiation of a goal template as a new goal identifying a name of a signal in said plurality of signals and a target value for said signal, and defining a counter for said signal, wherein said target value is identified in at least one constraint in said plurality of constraints; and
a plurality of instructions to a computer to automatically apply at least a predetermined rule comprising a constraint template, to said at least one constraint, to identify said goal template of said new goal based on an expression in said at least one constraint.

18. The one or more computer-readable storage media of claim 17 wherein said plurality of instructions comprise:
a plurality of first instructions for a parser to parse said at least one constraint using a grammar of a hardware verification language to identify at least said name of said signal, and said target value; and
a plurality of second instructions for expressing said goal in said hardware verification language to comprise at least said name, said target value and said counter.

19. The one or more computer-readable storage media of claim 17 wherein:
said at least one constraint comprises a set membership expression on said signal;
said plurality of instructions comprise instructions to automatically parse said at least one constraint using a grammar of said hardware verification language to identify at least said name of said signal, and a pair of limits of least one range in said set membership expression.

20. The one or more computer-readable storage media of claim 19 wherein:
within said range, when a subrange non-inclusive of each limit in said pair of limits is of size greater than 1, then said plurality of instructions defines a plurality of counters for said signal, including said counter and an additional counter.

21. The one or more computer-readable storage media of claim 19 wherein:
said plurality of instructions comprise instructions to express said goal in said hardware verification language to comprise at least said name and a plurality of illegal value counters including said counter, said plurality of illegal value counters comprising a counter for each limit in said pair of limits.

22. The one or more computer-readable storage media of claim 17 wherein:
said expression comprises a not in set membership expression on said signal; and
said plurality of instructions comprise instructions to automatically parse said at least one constraint using a grammar of said hardware verification language to identify at least said name of said signal, and a pair of limits of least one range based on said not in set membership expression.

23. The one or more computer-readable storage media of claim 17 wherein:
said expression comprises an equality expression on said signal;
said plurality of instructions comprise instructions to automatically parse said at least one constraint using a grammar of said hardware verification language, to identify at least said name of said signal and said target value, from said equality expression.

24. The one or more computer-readable storage media of claim 17 wherein:
said plurality of instructions comprise instructions to apply an additional rule to check if a type of an additional signal is an enumerated type and if so to use an additional goal template to instantiate an additional goal;
wherein said additional goal identifies said additional signal by an additional name and defines at least one additional counter thereof.

25. The one or more computer-readable storage media of claim 17 wherein:
said plurality of instructions comprise instructions to apply an additional rule to check if a type of said additional signal is a bit vector of width less than a predetermined limit and if so to automatically use an additional goal template to instantiate an additional goal;
wherein said additional goal identifies an additional signal and defines at least one additional counter thereof.

26. The one or more computer-readable storage media of claim 17 wherein:
a guard expression on creation of said at least one constraint is included in a declaration of said at least one constraint;
said plurality of instructions comprise instructions to automatically parse said declaration using a grammar of said hardware verification language to identify said guard expression and at least said name of said signal.

27. The one or more computer-readable storage media of claim 26 wherein:
said plurality of instructions comprise instructions to identify a plurality of minterms by automatically reducing said guard expression into a sum-of-products; and
said plurality of instructions comprise instructions to include in said goal, a plurality of counters including said counter, said plurality of counters comprising at least one counter for each minterm in said plurality of minterms.

28. The one or more computer-readable storage media of claim 17 wherein said goal is hereinafter first goal and said counter is hereinafter first counter, and wherein:
said plurality of instructions comprise instructions to express said goal in said hardware verification language to comprise at least said name and said first counter for a limit identified in said at least one constraint.

29. The one or more computer-readable storage media of claim 17 wherein said goal is hereinafter first goal and said counter is hereinafter first counter, and wherein:
said plurality of instructions comprise instructions to create a second goal comprising a second counter for a minterm in a plurality of minterms in a guard expression in a declaration of said at least one constraint.

30. The one or more computer-readable storage media of claim 29 wherein:
said plurality of instructions comprise instructions to create a third goal comprising a third counter that increments automatically when each of said first counter and said second counter increments.

31. The one or more computer-readable storage media of claim 17 wherein:
said plurality of instructions comprise instructions to use a constraint solver to automatically generate a test vector by use of said at least one constraint; and
said plurality of instructions comprise instructions to store said test vector in computer memory.

32. The one or more computer-readable storage media of claim 31 wherein:
said plurality of instructions comprise instructions to use a semantic checker to check said plurality of constraints for at least one limitation on use of said constraint solver.

33. The one or more computer-readable storage media of claim 17 wherein:
said plurality of instructions comprise instructions to parse said at least one constraint using a grammar of said hardware verification language to identify at least said name of said signal and said expression.

34. The one or more computer-readable storage media of claim 17 wherein:
said plurality of instructions comprise instructions to express additional goals in said hardware verification language to comprise at least said name and an additional counter.

35. The one or more computer-readable storage media of claim 17 wherein:
said plurality of instructions comprise instructions to express an additional goal in said hardware verification language to comprise at least said name of said signal and an additional counter for said signal.

36. The one or more computer-readable storage media of claim 17 wherein:
said plurality of instructions comprise instructions to express said goal in said hardware verification language to comprise at least said name and a condition comprising a guard expression in a declaration of said at least one constraint.

37. A computer programmed to generate in memory, goals for functional verification of a design of a circuit, the programmed computer comprising at least a processor and said memory, the programmed computer comprising:
means for receiving a plurality of constraints on a plurality of signals input to the circuit during simulation of the design;
wherein each signal in said plurality of signals is declared as having a random attribute in an object of a class defined in a hardware verification language;
means for automatically applying a predetermined rule comprising a constraint template to at least one constraint in said plurality of constraints, and based on an expression in said at least one constraint, to identify a goal template of a goal to be met by said functional verification during said simulation; and
means for automatically creating said goal in said memory by instantiation of said goal template with information from said at least one constraint;
wherein said goal identifies a signal in said plurality of signals by a name and a target value for said signal, and defines a counter for said signal.

38. The computer of claim 37 wherein:
said means for automatically applying comprises means for automatically parsing said at least one constraint using a grammar of said hardware verification language to identify at least said name of a signal and said expression.

39. The computer of claim 37 wherein said goal is hereinafter first goal and said counter is hereinafter first counter, the computer further comprising:
means for creating a second goal comprising a second counter for a minterm in a plurality of minterms in a guard expression in a declaration of said at least one constraint.

40. The computer of claim 37 wherein said at least one constraint comprises a set membership expression on said signal, the computer further comprising:
- means for parsing said at least one constraint using a grammar of said hardware verification language to identify at least said name of said signal, and a pair of limits of least one range in said set membership expression.

41. The computer of claim 37 further comprising:
- means for applying an additional rule to check if a type of an additional signal is an enumerated type and if so to use an additional goal template to instantiate an additional goal in said memory;
- wherein said additional goal identifies said additional signal by an additional name and defines at least one additional counter thereof.

* * * * *

UNITED STATES PATENT AND TRADEMARK OFFICE
CERTIFICATE OF CORRECTION

PATENT NO.         : 7,904,846 B2
APPLICATION NO.    : 11/831745
DATED              : March 8, 2011
INVENTOR(S)        : Shashidhar Anil Thakur et al.

It is certified that error appears in the above-identified patent and that said Letters Patent is hereby corrected as shown below:

Column 12
Line 4, insert a -- , -- after "constraint".
Line 20, insert -- at -- before "least".
Line 48, insert -- at -- before "least".

Column 14
Line 35, insert -- at -- before "least".
Line 59, insert -- at -- before "least".

Column 17
Line 8, insert -- at -- before "least".

Signed and Sealed this
Thirty-first Day of May, 2011

David J. Kappos
*Director of the United States Patent and Trademark Office*